(12) United States Patent
Tanaka et al.

(10) Patent No.: US 11,839,052 B2
(45) Date of Patent: Dec. 5, 2023

(54) APPARATUS HAVING MAGNETIC FLUID HEAT TRANSPORT SYSTEM

(71) Applicant: CANON KABUSHIKI KAISHA, Tokyo (JP)

(72) Inventors: Genki Tanaka, Tokyo (JP); Akira Watanabe, Tokyo (JP); Akinori Inagaki, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/666,323

(22) Filed: Feb. 7, 2022

(65) Prior Publication Data
US 2022/0264767 A1 Aug. 18, 2022

(30) Foreign Application Priority Data
Feb. 15, 2021 (JP) ................. 2021-021461

(51) Int. Cl.
*H05K 7/20* (2006.01)
*H04N 23/52* (2023.01)
*H04N 23/68* (2023.01)
*H01F 7/02* (2006.01)

(52) U.S. Cl.
CPC ......... *H05K 7/20272* (2013.01); *H04N 23/52* (2023.01); *H04N 23/687* (2023.01); *H01F 7/02* (2013.01)

(58) Field of Classification Search
CPC .. H05K 7/20272; H04N 23/52; H04N 23/687; H04N 23/60; H01F 7/02; H01F 7/0294; H01F 7/20
See application file for complete search history.

(56) References Cited

U.S. PATENT DOCUMENTS

| | | | |
|---|---|---|---|
| 2006/0185973 A1* | 8/2006 | Yazawa | F04B 19/006 204/155 |
| 2016/0116223 A1* | 4/2016 | Carpenter | F28D 15/00 165/104.28 |
| 2016/0330867 A1* | 11/2016 | Rohr | F28F 13/16 |
| 2016/0377328 A1* | 12/2016 | Hurbi | F25B 21/00 62/3.1 |
| 2018/0087849 A1* | 3/2018 | Lai | H01L 23/473 |
| 2020/0244887 A1* | 7/2020 | Ishida | G02B 27/646 |
| 2022/0045592 A1* | 2/2022 | Huang | G06F 1/1615 |

FOREIGN PATENT DOCUMENTS

| | | |
|---|---|---|
| JP | 64-12853 A | 1/1989 |
| JP | 4336902 B2 | 9/2009 |

* cited by examiner

*Primary Examiner* — Timothy J Henn
(74) *Attorney, Agent, or Firm* — Cowan, Liebowitz & Latman, P.C.

(57) ABSTRACT

An apparatus includes a conduit configured to circulate magnetic fluid, and a magnetic field generator that applies a magnetic field to the magnetic fluid. The conduit includes at least four areas of a first conduit area in which the magnetic fluid receives heat from a heating unit, a second conduit area from the first conduit area to a cooling unit, a third conduit area in which the magnetic fluid is cooled by the cooling unit, and a fourth conduit area from the cooling unit to the heating unit. When the apparatus is used, a volume of the magnetic fluid in one of the first to fourth conduit areas, in which a flow direction of the magnetic fluid coincides with a gravity direction, is larger than that of another conduit area, in which the flow direction of the magnetic fluid does not coincide with the gravity direction.

6 Claims, 12 Drawing Sheets

APPARATUS HAVING MAGNETIC FLUID HEAT TRANSPORT SYSTEM

BACKGROUND OF THE INVENTION

Field of the Invention

The present invention relates to a heat transport system using magnetic fluid (ferrofluid, magnetorheological fluid, or MR fluid).

Description of the Related Art

As a system for circulating magnetic fluid in a circulation conduit using a temperature gradient and a magnetic field. Japanese Patent Laid-Open No. 1-12853 discloses a system in which an inner diameter of a cooling unit is larger than that of a heating unit in the circulation conduit. This system structure can improve the circulation efficiency of the magnetic fluid by reducing the influence of the viscosity of the magnetic fluid, which changes with temperature, on the circulation resistance. Japanese Patent No. 4336902 discloses a heat transport system for driving the magnetic fluid by rotating a magnet.

Each of Japanese Patent Laid-Open No. 1-12853 and Japanese Patent No. 4336902 is silent about the gravity influence on the circulation efficiency of the magnetic fluid. When the magnetic fluid is driven by rotating the magnet, the magnet that stops rotating may hinder the circulation of the magnetic fluid.

SUMMARY OF THE INVENTION

The present invention is an apparatus that can improve the circulation efficiency (heat transport efficiency) of the magnetic fluid using a conduit designed based on the viscosity of the magnetic fluid and the gravity, and an apparatus that can smoothly circulate the magnetic fluid even if the magnet stops rotating.

An apparatus according to one aspect of the present invention includes a heating unit, a cooling unit, a conduit configured to circulate magnetic fluid between the heating unit and the cooling unit, and a magnetic field generator configured to apply a magnetic field to the magnetic fluid. The conduit includes at least four areas of a first conduit area in which the magnetic fluid receives heat from the heating unit, a second conduit area from the first conduit area to the cooling unit, a third conduit area in which the magnetic fluid is cooled by the cooling unit, and a fourth conduit area from the cooling unit to the heating unit. When the apparatus is used, a volume of the magnetic fluid in one of the first to fourth conduit areas, in which a flow direction of the magnetic fluid coincides with a gravity direction, is larger than that of another of the first to fourth conduit areas, in which the flow direction of the magnetic fluid does not coincide with the gravity direction.

An apparatus according to another aspect of the present invention includes a heating unit, a cooling unit, a conduit configured to circulate magnetic fluid between the heating unit and the cooling unit, a first magnetic field generator configured to apply a magnetic field to the magnetic fluid, and a second magnetic field generator rotatable and configured to apply a magnetic field to the magnetic fluid to the magnetic fluid. The first magnetic field generator applies the magnetic field to the magnetic fluid in a conduit area of the conduit, which is located on a downstream side of the cooling unit and on an upstream side of the heating unit, and configured to provide a positive temperature gradient to the magnetic fluid. The second magnetic field generator applies the magnetic field to the magnetic fluid in a conduit area of the conduit, which is located on a downstream side of the heating unit and on an upstream side of the cooling unit, and configured to cause an absolute value of the temperature gradient of the magnetic fluid to be smaller than the positive temperature gradient.

Further features of the present invention will become apparent from the following description of exemplary embodiments reference to the attached drawings.

DESCRIPTION ACCORDING TO THIS EMBODIMENTS

Referring now to the accompanying drawings, a description will be given of embodiments according to the present invention.

Figure 1A:
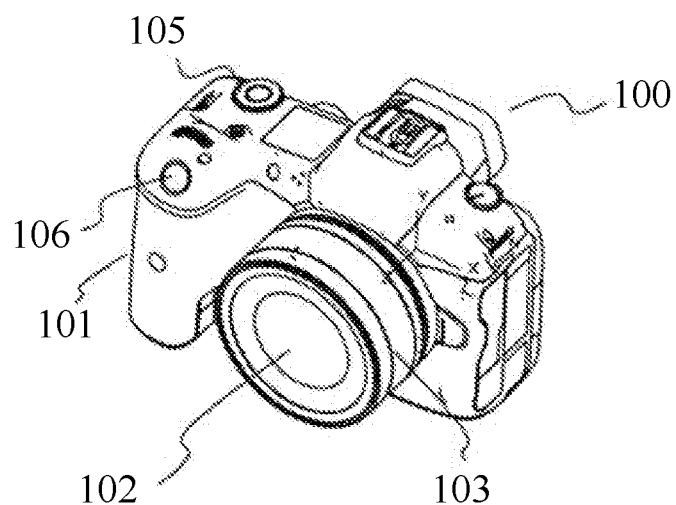
FIGS. 1A to 1C are perspective views illustrating a camera and an interchangeable lens according to this embodiment.
Figure 1B:
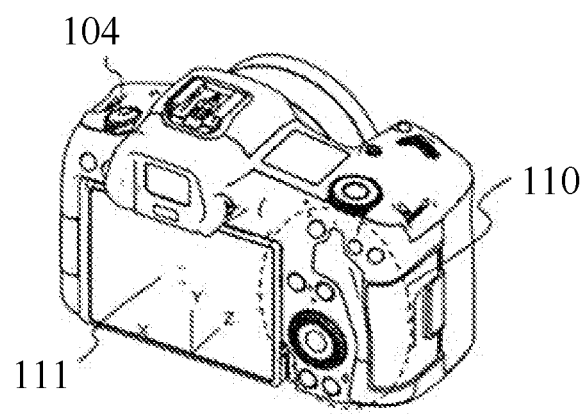
Figure 1C:
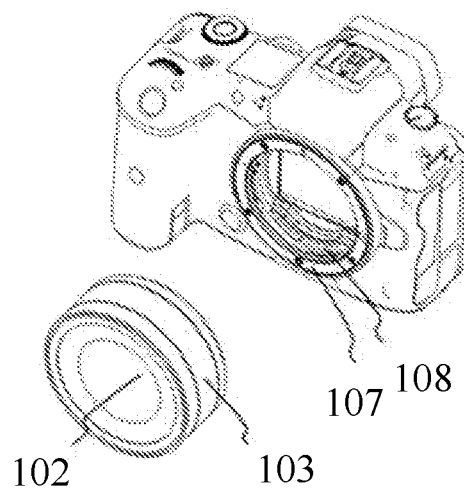

FIGS. 1A to 1C illustrate a lens interchangeable type digital camera (simply referred to as a camera hereinafter) as an image pickup apparatus attachable to and detachable from an interchangeable lens 102. FIG. 1A illustrates a camera 100 and the interchangeable lens 102 viewed from the diagonally front side (object side), FIG. 1B illustrates the camera 100 viewed from the diagonally rear side (backside), and FIG. 1C illustrates the camera 100 detached from the interchangeable lens 102.

A front grip 101 protruding forward is provided on a front surface of the camera 100 so that the user can grip the camera 100. A mount unit 107 that allows the interchangeable lens 102 to be attached and detached is provided at the center of the front surface of the camera 100.

A rotary ring 103 is provided on an outer circumference of the interchangeable lens 102. The rotary ring 103 is rotatable by the user around an optical axis of the interchangeable lens 102. The user can assign a function of changing an imaging condition, such as a focus position and an exposure value, to the rotary ring 103. A power lever 104, a mode dial 105, and a release button 106 are provided on an upper surface of the camera 100. The power lever 104 is an operating member that accepts a user's operation to switch powering on and off of the camera 100. The mode dial 105 is an operating member that accepts a rotating operation of the user to switch an imaging mode. The imaging mode includes a manual still image capturing mode in which the user can arbitrarily set an imaging condition such as a shutter speed and an F-number (aperture value), an automatic still imaging mode that automatically sets a proper exposure amount, and a motion imaging mode used to capture a motion image. The release button 106 is an operating member that accepts a user's pressing operation to instruct imaging.

A rear operating unit 110 and a display unit 111 are provided on the rear surface of the camera 100. When the camera 100 is powered on, the display unit 111 displays a live-view image corresponding to an imaging signal from an unillustrated image sensor that has captured (photoelectrically converted) an object image formed by the interchangeable lens 102. The display unit 111 displays an imaging parameter such as the shutter speed and the aperture value. The user can change a set value of the imaging parameter by operating the rear operating unit 110 while viewing the display of the display unit 111. The rear operating unit 110 includes a play button for instructing a play of a recorded captured image and a menu button for shifting to a detailed setting screen of the camera 100.

Electric contacts 108 are provided on the mount unit 107 of the camera 100. The camera 100 communicates with the interchangeable lens 102 mounted on the mount unit 107 and supplies power to the interchangeable lens 102 via the electric contacts 108.

Figure 2:
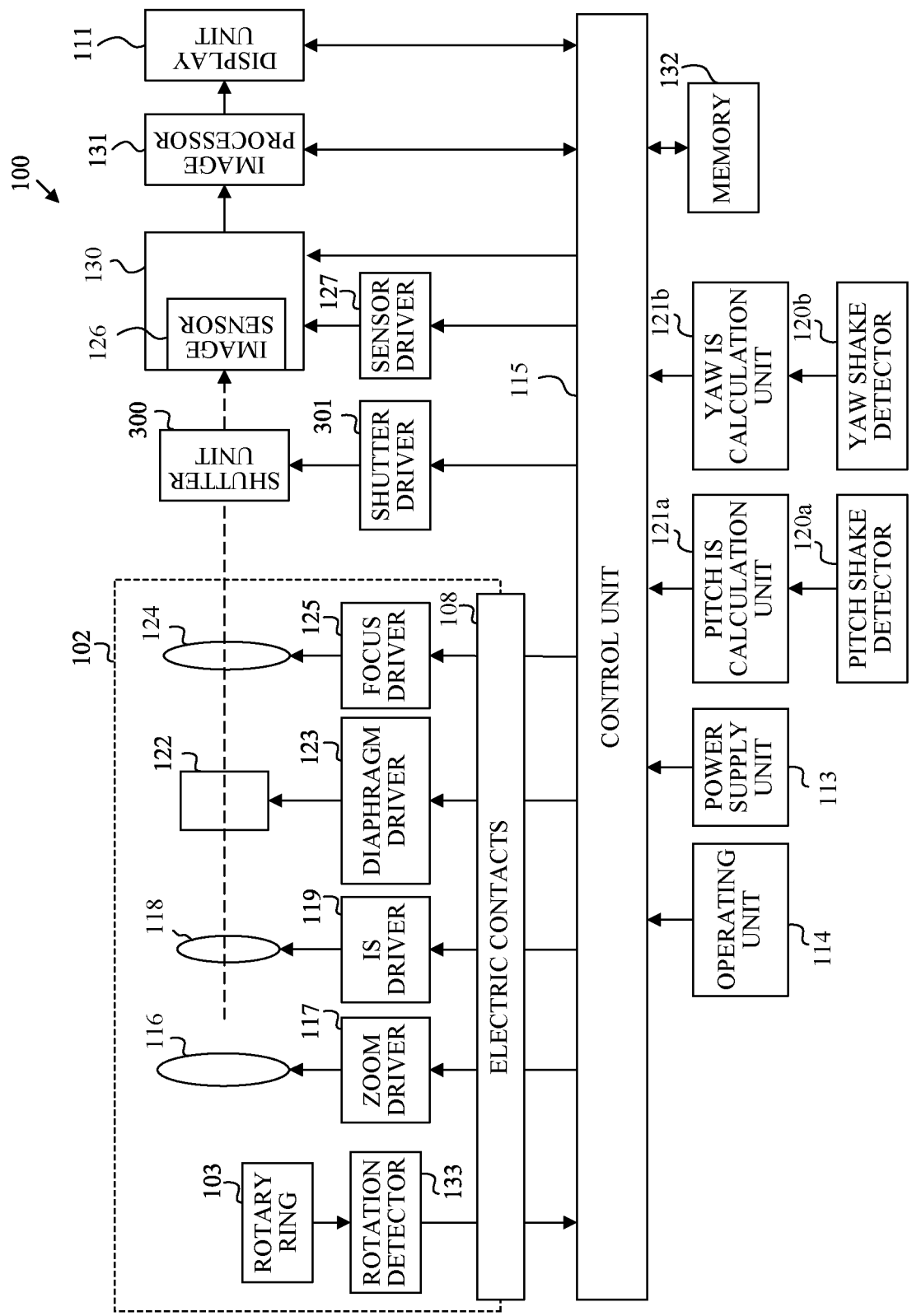
FIG. 2 is a block diagram illustrating a configuration of the camera and the interchangeable lens according to this embodiment.

FIG. 2 illustrates electric and optical configurations of the camera 100 and the interchangeable lens 102. The camera 100 includes a power supply unit 113 that supplies power to each component in the camera 100, and an operating unit 114 that includes the power lever 104, the mode dial 105, the release button 106, and the rear operating unit 110 described above. A control unit 115 controls the entire camera system including the camera 100 and the interchangeable lens 102. The interchangeable lens 102 communicates with the control unit 115 via the electric contacts 108. The control unit 115 controls the entire camera system by reading and executing a control program stored in an unillustrated memory.

The interchangeable lens 102 includes a zoom unit 116 including a zoom lens that is moved in the optical axis direction during a magnification variation (zooming), and a lens image-stabilizing (IS) unit 118 that includes a shift lens. The shift lens is moved (shifted) in two directions (X direction and Y direction in FIGS. 1A and 1B) orthogonal to the optical axis to reduce (correct) image shakes. The interchangeable lens 102 includes a diaphragm unit 122 having a light amount adjusting function, and a focus unit 124 including a focus lens that is moved in the optical axis direction during focusing.

The interchangeable lens 102 has a rotation detector 133 that detects the rotation of the rotary ring 103. When the rotary ring 103 is rotated and a magnification change instruction is input via the rotation detector 133, the control unit 115 controls driving of the zoom unit 116 via a zoom driver 117 provided to the interchangeable lens 102 so as to provide the magnification variation.

The control unit 115 controls driving of the diaphragm unit 122 via a diaphragm driver 123 provided to the interchangeable lens 102 according to a set value of the aperture value received from the operating unit 114 or a luminance signal acquired from an image processor 131. The control unit 115 provides autofocusing by controlling driving of the focus unit 124 via a focus driver 125 provided to the interchangeable lens 102 according to a focusing signal acquired from the image processor 131.

The camera 100 is provided with a pitch IS calculation unit 121a and a yaw IS calculation unit 121b. The pitch IS calculation unit 121a calculates shift positions of the lens IS unit 118 (shift lens) and a sensor IS unit 130 (image sensor 126) in the Y direction using the vibration signal from the pitch IS detector 120a. The yaw IS calculation unit 121b calculates shift positions of the lens IS unit 118 and the sensor IS unit 130 in the X direction using the vibration signal from the yaw IS detector 120b. The camera 100 includes a sensor driver 127 that drives the sensor IS unit 130. The interchangeable lens 102 includes an IS driver 119 that drives the lens IS unit 118. The control unit 115 controls the shift positions of the lens IS unit 118 and the sensor IS unit 130 via the IS driver 119 and the sensor driver 127 according to the shift positions in the pitch and yaw directions calculated by the pitch and yaw IS calculation units 121a and 121b. Thereby, the IS operation for correcting the image shakes is performed.

The camera 100 includes a focal plane shutter unit (simply referred to as a shutter unit hereinafter) 300 and a shutter driver 301 for driving the focal plane shutter unit 300. The control unit 115 controls driving of the shutter unit 300 via the shutter driver 301 in response to the imaging instruction operation on the release button 106. Thereby, the object image formed by the interchangeable lens 102 is formed on the image sensor 126, and the image sensor 126 generates and outputs an imaging signal by its photoelectric conversion function. The image processor 131 performs various image processing for the imaging signal to generate image data. Of the image data, the data of the captured image for recording is stored in a memory 132 that includes a semiconductor memory or the like. The display unit 111 displays a live-view image corresponding to the image signal, and plays and displays the captured image recorded as data in the memory 132.

Figure 3A:
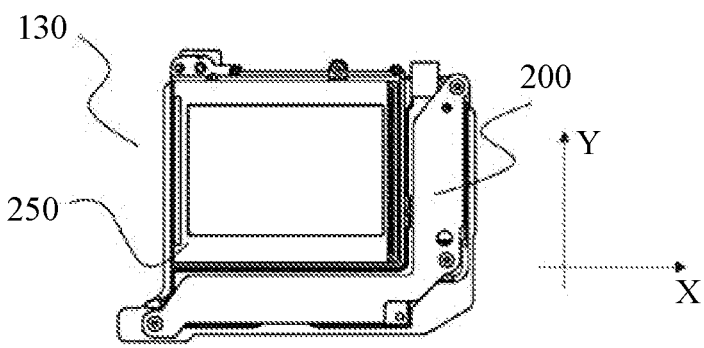
FIGS. 3A to 3C illustrate a structure of a sensor image-stabilizing (IS) unit in the camera according to this embodiment.
Figure 3B:
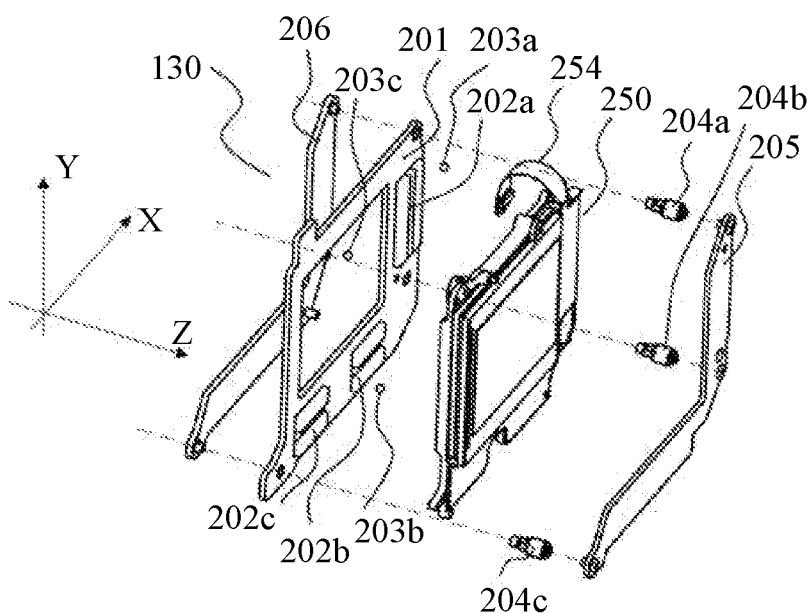
Figure 3C:
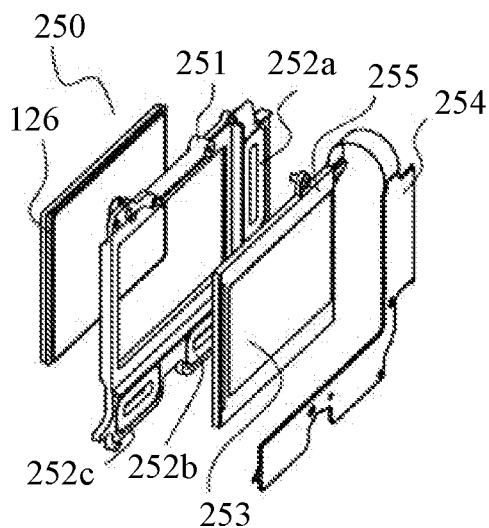

FIGS. 3A to 3C illustrate the structure of the sensor IS unit 130. FIG. 3A illustrates the sensor IS unit 130 viewed from the front side. The sensor IS unit 130 includes a fixed unit 200 and a movable unit 250. FIG. 3B illustrates the fixed unit 200 of the sensor IS unit 130 in an exploded manner. FIG. 3C illustrates the movable unit 250 of the sensor IS unit 130 in an exploded manner.

The fixed unit 200 includes a base plate 201, and magnets 202a, 202b and 202c are fixed to the base plate 201. Balls 203a, 203b, and 203c are disposed and held between the base plate 201 and a holding frame 251 of the movable unit 250, which will be described later. The fixed unit 200 is fixed to a base unit 140 (see FIG. 4) described later.

The base plate 201 has attachment holes for attaching spacers 204a, 204b, and 204c. A front yoke 205 is fixed to one ends of the spacers 204a, 204b, and 204c, and a rear yoke 206 is fixed to the other ends of them. In the space created between the base plate 201 and the front yoke 205, the movable unit 250 is held so as to be movable (shiftable) in the XY plane in this figure.

The magnets 202a, 202b, and 202c are magnetized so as to generate a magnetic flux density in the optical axis direction (Z direction), and disposed between the front yoke 205 and the rear yoke 206 to face them. The front yoke 205, the magnets 202a, 202b, and 202c, and the rear yoke 206 form a magnetic circuit (closed magnetic path). The front yoke 205 and the rear yoke 206 are attracted by the magnetic forces of the magnets 202a, 202b, and 202c.

The movable unit 250 includes a holding frame 251. The holding frame 251 holds the image sensor 126, coils 252a, 252b, and 252c, and an optical filter 253. The coils 252a, 252b, and 252c are disposed at positions facing the magnets 202a, 202b, and 202c of the fixed unit 200, respectively. A coil substrate 254 is electrically connected to the coils 252a, 252b, and 252c.

The coil substrate 254 includes an unillustrated position detecting element. The position detecting element can use a Hall element that detects the position of the movable unit 250 by using the above magnetic circuit. The coil substrate 254 is connected to an unillustrated main substrate.

The coils 252a, 252b, and 252c, the coil substrate 254, and the position detecting element (Hall element) are included in the sensor driver 127 described above, and a chip such as a CPU constituting the control unit 115 described above is mounted on the main substrate. When the sensor driver 127 that receives the control signal from the control unit 115 energizes the coils 252a, 252b, and 252c, a force according to the Fleming's left-hand rule is generated, and the movable unit 250 is shifted in the XY plane for the image stabilization.

The image sensor 126 is connected to the main board via unillustrated flexible printed circuits (FPC).

The optical filter 253 is held in a filter holding frame 255. The optical filter 253 has a rectangular shape that covers a wider range than the effective pixel area of the image sensor 126. The filter holding frame 255 is fixed to the holding frame 251.

Figure 4:
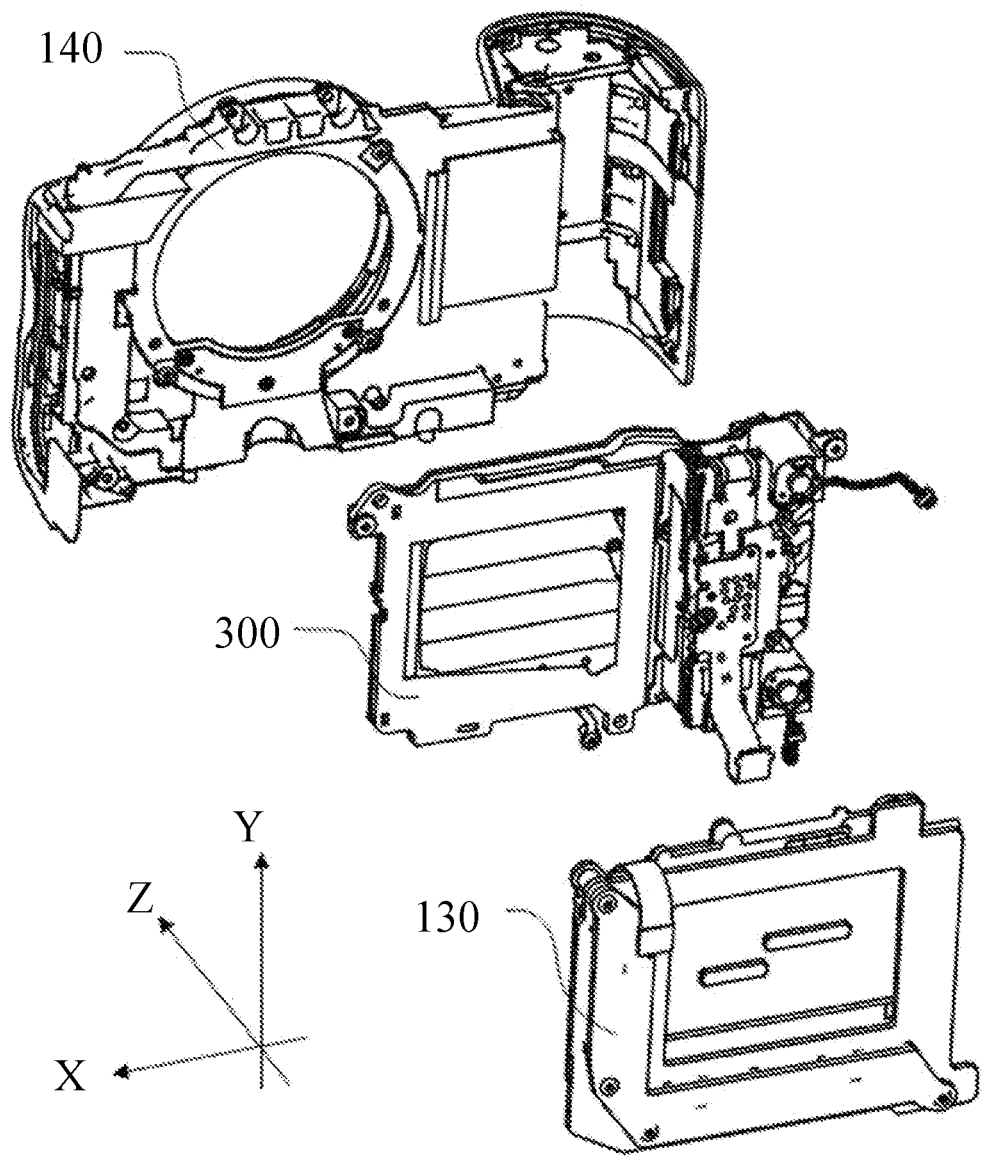
FIG. 4 illustrates structures of a base unit, a sensor IS unit, and a shutter unit in the camera according to this embodiment.

FIG. 4 illustrates the base unit 140, the sensor IS unit 130, and the shutter unit 300 in the camera 100. The fixed unit 200 of the sensor IS unit 130 is fixed to the base unit 140.

The shutter unit 300 is disposed between the base unit 140 and the sensor IS unit 130 and stacked up in the Z direction. The base unit 140 includes a base member for fixing an unillustrated exterior cover. From the front surface portion to the side surface portion of the base member, the front grip 101 having elasticity on the front surface layer and used for the user to grip is fixed with a double-sided tape or the like.

A description will now be given of the shutter unit 300. The shutter unit 300 includes a blade unit, a blade driver, and a shutter control unit.

Figure 5A:
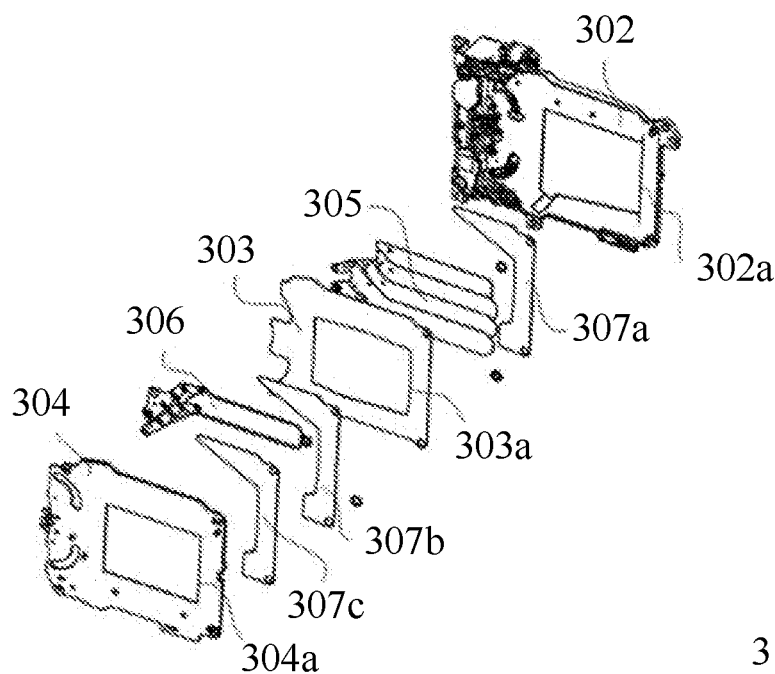
FIGS. 5A to 5C illustrate the structure of the shutter unit according to this embodiment.

First, the blade unit will be described. FIG. 5A illustrates the shutter unit 300 viewed from the front side in an exploded manner. Reference numeral 302 denotes a shutter base plate, reference numeral 303 denotes a partition plate, reference numeral 304 denotes a cover plate, and reference numerals 307a to 307c denote spacers. The shutter base plate 302, the partition plate 303, and the cover plate 304 are formed with apertures 302a, 303a, and 304a through which the light flux from the interchangeable lens 102 passes.

Reference numeral 305 denotes front blades and reference numeral 306 denotes rear blades, each of which includes a plurality of light-shielding blades and two rotating arms that rotatably support these light-shielding blades. Two blade chambers are formed between the shutter base plate 302 and the cover plate 304 by the partition plate 303 and the spacers 307a to 307c, the front blades 305 are disposed in one blade chamber and the rear blades 306 are disposed in the other blade chamber. During exposure of the image sensor 126, the front blades 305 move in the opening direction from a position where the aperture is closed, and the rear blades 306 move in the closing direction from a position where the aperture is opened.

Figure 5B:
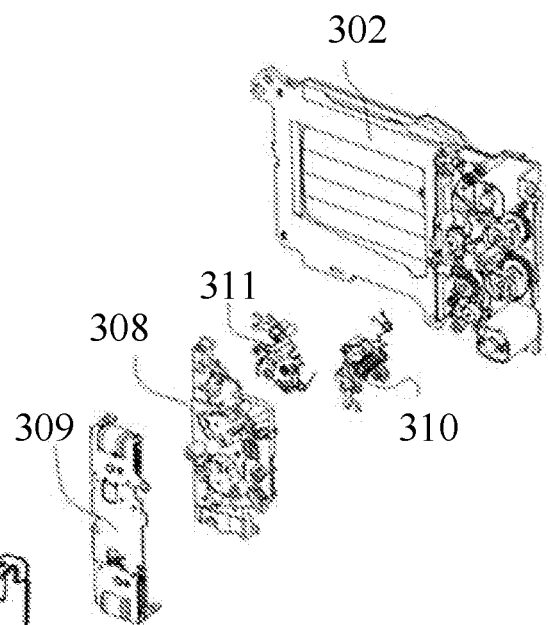

The blade driver will be explained. FIG. 5B illustrates the shutter unit 300 viewed from the image sensor side in an exploded manner. Reference numeral 308 denotes an upper main plate, reference numeral 309 denotes the shutter control unit, reference numeral 310 denotes a front-blades driving lever unit, and reference numeral 311 denotes a rear-blades driving lever unit. During exposure, the current flows from an unillustrated capacitor to the coil of the shutter control unit 309. Thereby, the front-blades driving lever unit 310 and the rear-blades driving lever unit 311 are driven, and the front blades 305 and the rear blades 306 are moved.

Figure 5C:
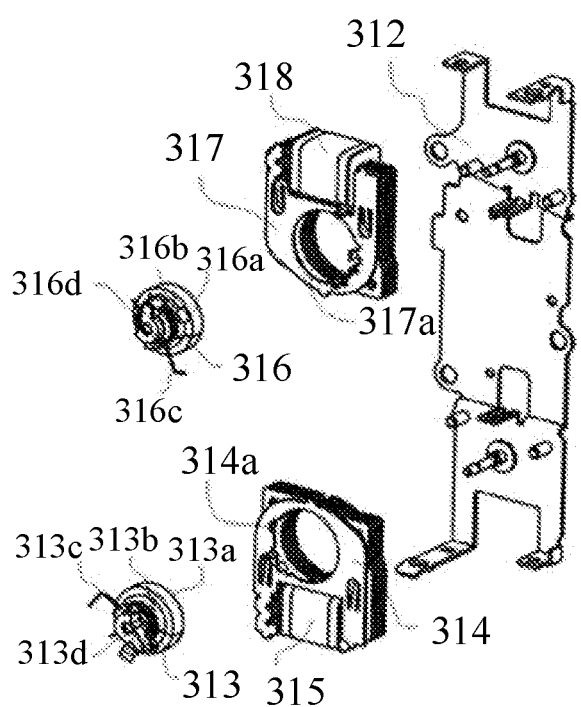

The shutter control unit 309 will be described, FIG. 5C illustrates the shutter control unit 309 viewed from the front side in an exploded manner. Reference numeral 312 denotes an MG main plate.

Reference numeral 313 is a front MG cam unit, which includes a front magnet 313a, a front collar 313b, a front MG return spring 313c, and a front MG cam 313d. The front magnet 313a is a circular permanent magnet. The front MG return spring 313c is assembled on the outer circumference of the front MG cam 313d. Then, in order to prevent the front MG return spring 313c from coming into contact with the front magnet 313a, the front collar 313b having a flange portion is assembled into the front MG cam 313d. The front magnet 313a is press-fitted and adhered to the outer periphery of the front MG cam 313d. The front MG cam unit 313 assembled in this way is rotatably attached to the first shaft portion of the MG main plate 312.

Reference numeral 314 denotes a front yoke, and has a hole portion 314a having an inner diameter larger than a diameter of the front magnet 313a. Reference numeral 315 denotes a front coil, which is attached to the front yoke 314. When assembled into the MG main plate 312, the front magnet 313a is disposed in the hole portion 314a in the front yoke 314.

The front MG cam unit 313 is urged clockwise by the front MG return spring 313c when viewed from the front side. When the front MG cam 313d comes into contact with a first stopper portion of the upper main plate 308, the front MG cam unit 313 is stopped at the set position.

Reference numeral 316 is a rear MG cam unit, which includes a rear magnet 316a, a rear collar 316b, a rear MG return spring 316c, and a rear MG cam 316d. The rear magnet 316a is a circular permanent magnet. The rear MG return spring 316c is assembled into the outer circumference of the rear MG cam 316d. Then, in order to prevent the rear MG return spring 316c from coming into contact with the rear magnet 316a, the rear collar 316b having a flange portion is assembled into the rear MG cam 316d. The rear magnet 316a is press-fitted and adhered to the outer periphery of the rear MG cam 316d. After assembled in this way, the MG cam unit 316 is rotatably attached to the second shaft portion of the MG main plate 312.

Reference numeral 317 is a rear yoke, and has a hole portion 317a having an inner diameter larger than a diameter of the rear magnet 316a. Reference numeral 318 denotes a rear coil, which is attached to the rear yoke 317. When assembled into the MG main plate 312, the rear magnet 316a is disposed in the hole portion 317a in the rear yoke 317.

The rear MG cam unit 316 is urged clockwise by the rear MG return spring 316c when viewed from the front side. When the rear MG cam 316c comes into contact with a second stopper portion of the upper main plate 308, the rear MG cam unit 316 is stopped at the set position.

The coils 315 and 318 are connected to a main substrate via, an unillustrated FPC. As described above, when the current flows from the unillustrated capacitor to the coils 315 and 318, the front-blades driving lever unit 310 and the rear-blades driving lever unit 311 are driven, and the front blades 305 and the rear blades 306 are moved.

Figure 6:
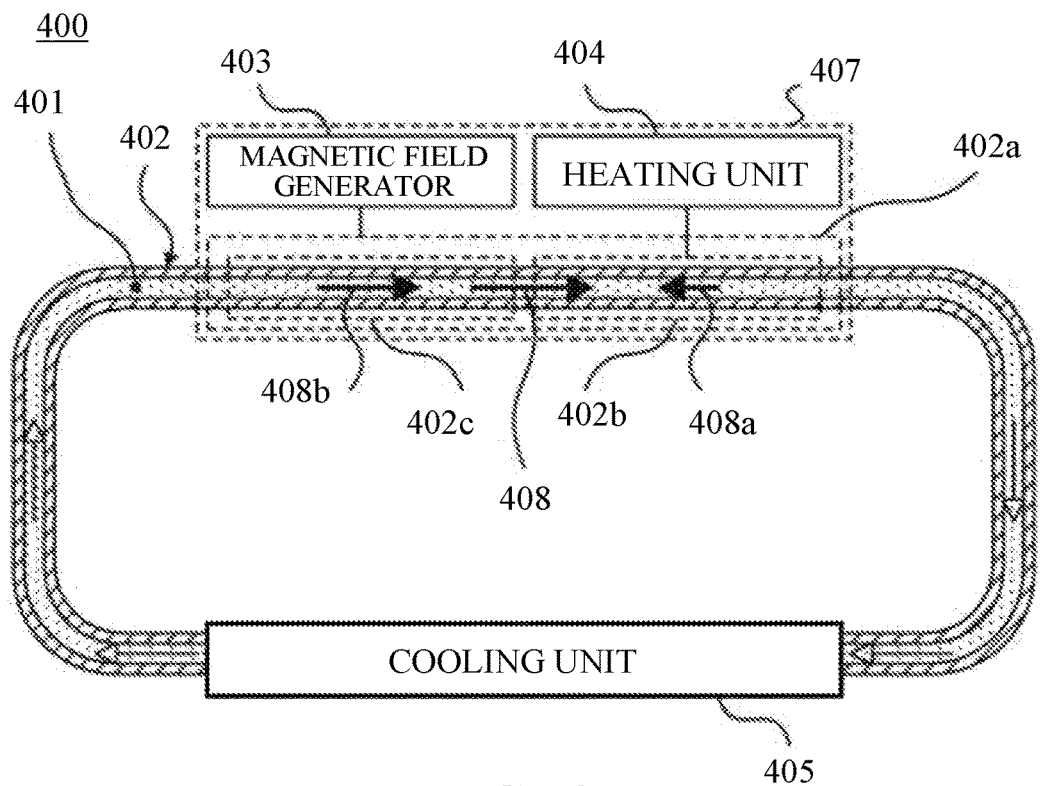
FIG. 6 illustrates magnetic fluid heat transport system in the camera according to this embodiment.

Referring now to FIG. 6, a description will be given of magnetic fluid heat transport system 400 provided in the camera 100. FIG. 6 schematically illustrates the structure of the magnetic fluid heat transport system 400. In FIG. 6, reference numeral 401 denotes magnetic fluid. Reference numeral 402 denotes a circulation conduit through which the magnetic fluid 401 circulates. Reference numeral 403 denotes a magnetic field generator such as a magnet. Reference numeral 404 denotes a heating unit. Reference numeral 405 denotes a cooling unit. Reference numeral 402a denotes a magnetic field acting unit to which the magnetic field generated by the magnetic field generator 403 is applied in the circulation conduit 402. Reference numeral 402b denotes a heated unit that receives heat from the heating unit 404 in the magnetic field acting unit 402a. Reference numeral 402c denotes an unheated unit that does not receive heat from the heating unit 404 in the magnetic field acting unit 402a. Reference numeral 407 surrounded by a dotted line denotes a power converter including the magnetic field generator 403, the heating unit 404, and the magnetic field acting unit 402a.

Arrows 408a and 408b denote typical directions and magnitudes of magnetic volume forces acting on the magnetic fluid 401 in the heated unit 402b and the unheated unit 402c of the circulation conduit 402. An arrow 408 indicates a driving force as a resultant force of these forces. Other arrows indicate a flow direction of the magnetic fluid 401 in the circulation conduit 402.

The magnetic fluid heat transport system 400 converts the heat energy of the heating unit 404 into the kinetic energy of the magnetic fluid in the power converter 407. When the heating unit 404 uses an electronic component to be cooled (such as the image sensor 126 of the camera 100), a self-circulating liquid cooling system is created that circulates the magnetic fluid using the heat and transports the heat to the cooling unit 405 for cooling. If a permanent magnet is used as the magnetic field generator 403, this liquid cooling system does not require a power supply, saves power, and does not generate extra heat.

The principle of the magnetic fluid heat transport system 400 is as follows: The magnetic field acting unit 402a is provided to part of the circulation conduit 402 filled with the magnetic fluid 401, and the magnetic field generated by the magnetic field generator 403 is applied to the magnetic fluid 401 inside the magnetic field acting unit 402a. One of two areas of about half of the magnetic field acting unit 402a is set to the heated unit 402b, and the other is set to the unheated unit 402c so as to generate magnetic fields that are opposite to each other in these areas along the conduit direction. That is, the direction of the internal magnetic field in each area is set to a direction in which the magnetic fluid 401 receives the force (magnetic volume forces 408a and 408b in the conduit direction) attracted to the other area side.

In this structure, when the heated unit 402b is heated by the heating unit 404 to raise the temperature of the internal magnetic fluid 401, the magnetism of the magnetic fluid 401 weakens due to its temperature sensitivity and the magnetic body force 408a from the magnetic field also weakens. Thereby, the magnetic volume forces of the magnetic fluid 401 in the heated unit 402b and the magnetic fluid 401 in the unheated unit 402c lose the balance, so that the moving force (driving force 408) of the magnetic fluid 401 is generated from the unheated unit 402c toward the heated unit 402b. Due to this principle, the magnetic fluid 401 circulates in the circulation conduit 402, and the heat received by the heated unit 402b is transported to the cooling unit 405.

The magnetic fluid 401 can use a fluid in which ferromagnetic fine particles such as magnetite and manganese-zinc-ferrite are dispersed in a mother liquor such as water or oil.

A tube or pipe constituting the circulation conduit 402 may be formed by using a nonmagnetic material such as resin, rubber, copper, or aluminum so that a magnetic field acts inside. In order to increase the power conversion efficiency, the heated unit 402b may transfer heat as much as possible to the magnetic fluid 401, and the unheated unit 402c may transfer heat as little as possible to the magnetic fluid 401. Hence, the circulation conduit 402 may include a plurality of parts by partially changing the material. For example, the heated unit 402b may be made of copper having a high thermal conductivity, and the unheated unit 402c may be made of nylon having a low thermal conductivity.

The magnetic field generator 403 may use a permanent magnet, such as a neodymium magnet that generates a high density magnetic flux. In this case, a yoke made of iron or the like may be combined so that the magnetic field in the conduit direction (flow direction) becomes strong, or a plurality of magnetic field generators 403 may be provided. The magnetic field generator 403 may use an electromagnet that generates a magnetic field by the energization because the magnetic field intensity or turning on and off of the magnetic field can be easily controlled. Alternatively, the magnetic field generator 403 may use a coil that generates a magnetic field by the energization.

As described above, the heating unit 404 is a target to be cooled, such as an electronic component. However, for example, one end of a heat conductive member such as a metal sleeve or a graphite sheet may be connected so as to surround the tube or pipe, and the other end may be connected to the target to be cooled so as to indirectly transfer the heat of the target to be cooled to the heated unit 402c.

The cooling unit 405 is provided to cool down the magnetic fluid 401 which has been highly heated by the heating unit 404 and flowed from the heated unit 402b, and to return it to the unheated unit 402c. The cooling unit 405 can use, for example, a radiator incorporated in the middle of the circulation conduit 402 or a cooling fin attached to part of the circulation conduit 402. The circulation conduit 402 itself may be disposed in the cooling air from the fan or another refrigerant to form the cooling unit 405.

First Embodiment

Figure 7:
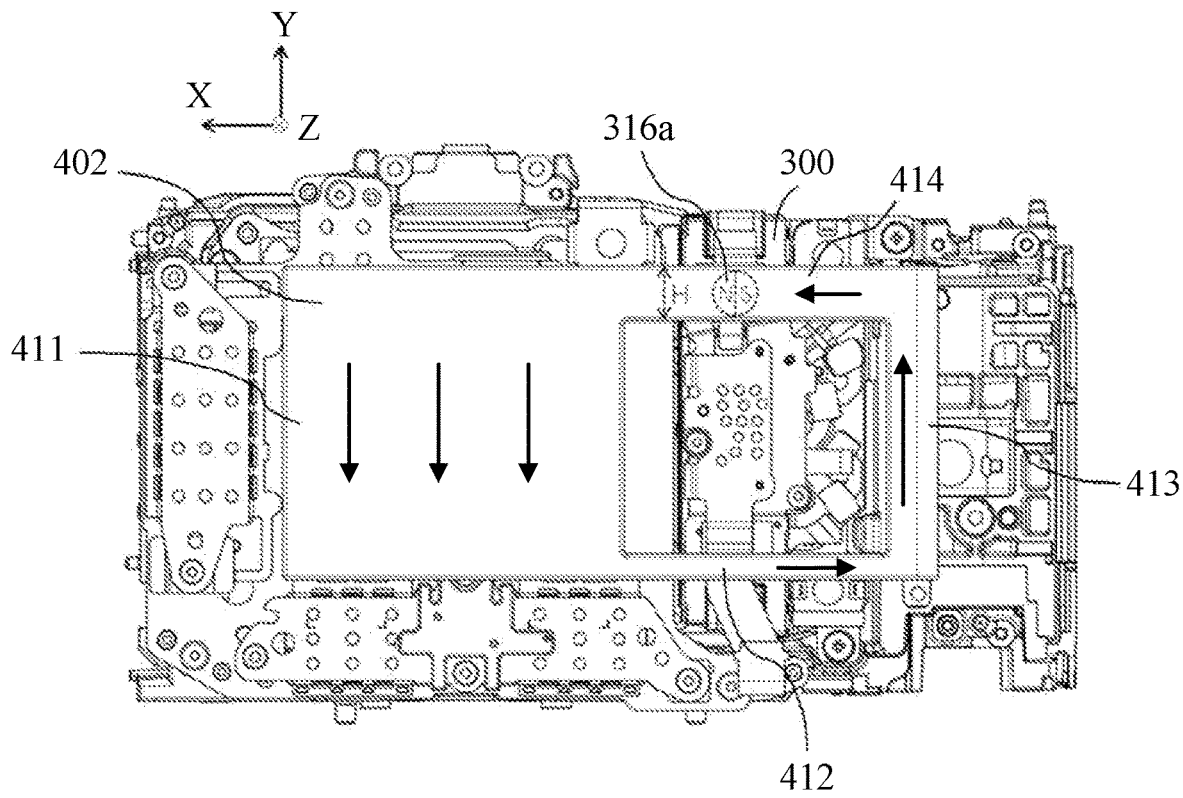
FIG. 7 is a rear view illustrating a camera that includes magnetic fluid heat transport system according to a first embodiment.
Figure 8A:
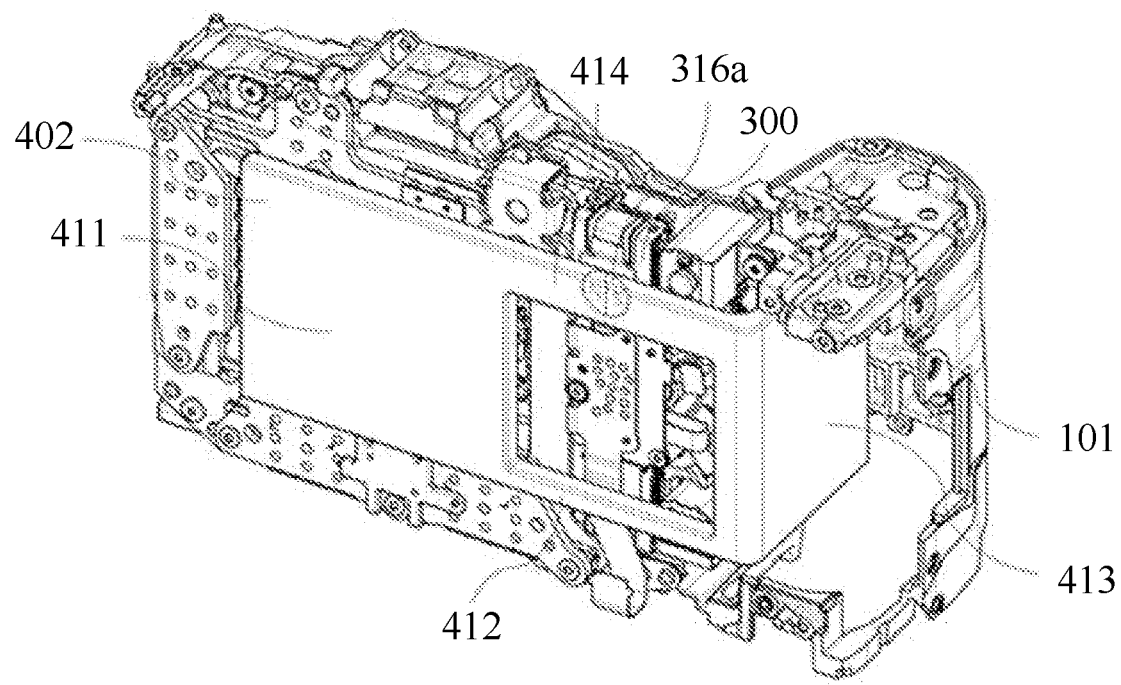
FIGS. 8A and 8B are a perspective view and an exploded perspective view of the camera that includes the magnetic fluid heat transport system according to the first embodiment.
Figure 8B:
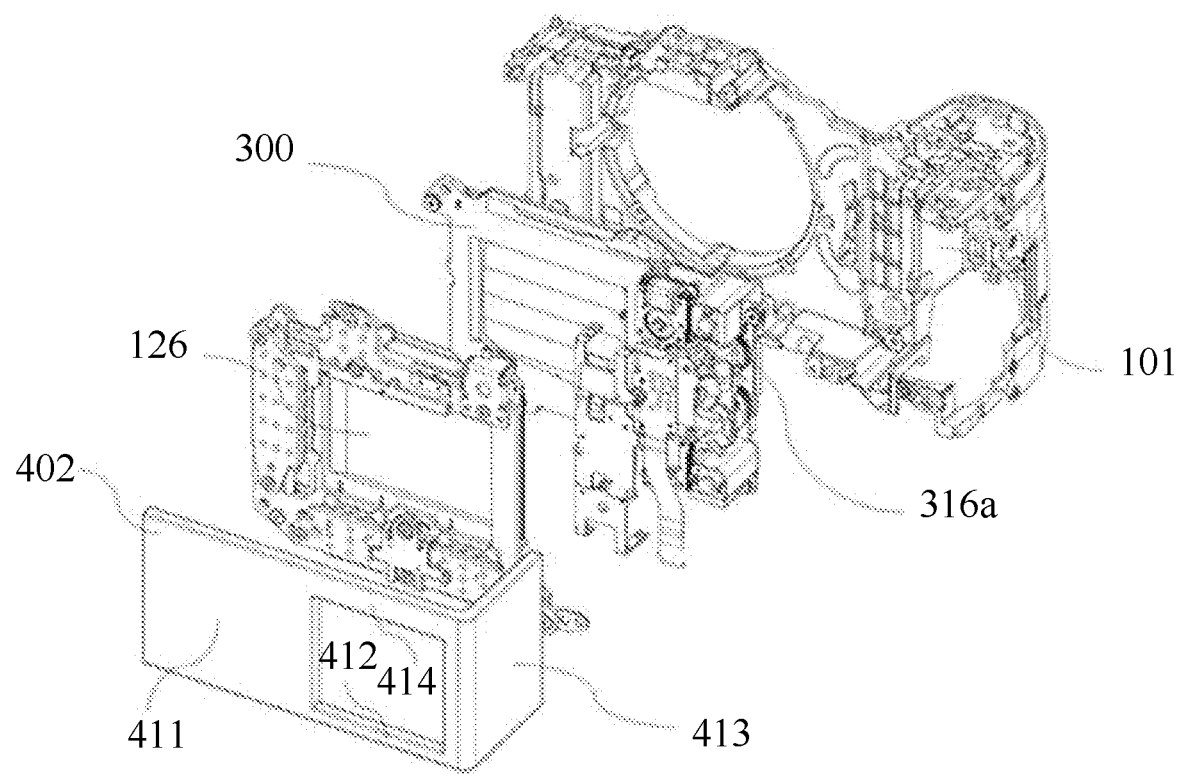

FIGS. 7, 8A, and 8B illustrate a first embodiment as an example of mounting the magnetic fluid heat transport system 400 onto the camera 100. FIG. 7 illustrates the camera 100 mounted with the magnetic fluid heat transport system 400 and viewed from the Z direction. FIG. 8A illustrates the camera 100 viewed from the diagonally rear side, and FIG. 8B illustrates the camera 100 in an exploded manner.

In this embodiment, the heating unit 404 in FIG. 6 is the image sensor 126, the cooling unit 405 is the front grip 101, and the magnetic field generator 403 is the rear magnet 316a of the shutter unit 300. The circulation conduit 402 is provided so as to overlap the magnetic field generator 403 (rear magnet 316a) in the Z direction.

Of the circulation conduit 402, an area thermally connected to the image sensor 126 (and heated by the heating unit 404) will be referred to as a first conduit area 411, and an area from the image sensor 126 to the cooling unit 405 will be referred to as a second conduit area 412. An area thermally connected to the cooling unit 405 (and cooled by the cooling unit 405) will be referred to as a third conduit area 413, and an area from the cooling unit 405 to the image sensor 126 will be referred to as a fourth conduit area 414.

In FIG. 7, when a −Y direction is a direction in which the gravity acts on the camera 100 (gravity direction), the magnetic fluid in the first conduit area 411 flows in the −Y direction as illustrated by an arrow, and the magnetic fluid in the second conduit area 412 flows in the −X direction. The magnetic fluid in the third conduit area 413 flows in the +Y direction, and the magnetic fluid in the fourth conduit area. 414 flows in the +X direction.

When the camera (image pickup apparatus) is used, the flow direction of the magnetic fluid flowing through the first conduit area 411 coincides with the gravity direction. The volume in the conduit of the first conduit area 411 (that is, the volume of the magnetic fluid in the first conduit area 411) is larger than the volume in the conduit of any of the second conduit area 412, the third conduit area 413, and the fourth conduit area 414. Regarding the influence of the gravity on the magnetic fluid 401, a circulation assisting component is stronger than a circulation resisting component. Thus, in this embodiment, the volume of the magnetic fluid in the first conduit area 411 in which the flow direction of the magnetic fluid coincides with the gravity direction is made larger than the volume of the magnetic fluid in the other conduit areas 412 to 414 in which the flow direction does not coincide with the gravity direction.

The magnetic fluid has a characteristic in that its viscosity decreases as the temperature rises and its viscosity increases as the temperature falls. The viscosity of the magnetic fluid flowing through the fourth conduit area 414 is larger than the viscosity of the magnetic fluid flowing through the second conduit area 412, and the flow resistance is also larger. A sectional area of the fourth conduit area 414 orthogonal to the flow direction of the magnetic fluid is made larger than a sectional area orthogonal to the same flow direction of the second conduit area 412. Thereby, the volume in the conduit of the fourth conduit area 414 becomes larger than that of the second conduit area 412, and the volume of the magnetic fluid flowing through the fourth conduit area 414 is larger than the volume of the magnetic fluid flowing through the second conduit area 412. As a consequence, the flow resistance of the magnetic fluid is canceled out, and the magnetic fluid can be smoothly circulated.

In each of the first to fourth conduit areas 411 to 414, the conduit sectional area may be partially changed. By changing the conduit sectional area, that is, the volume of the flowing magnetic fluid according to the temperature distribution of the magnetic fluid in each conduit area, the overall flow rate and flow velocity of the circulation conduit 402 can be properly adjusted. For example, in the second conduit area 412, the temperature of the magnetic fluid near the first conduit area. 411 is higher than the temperature of the magnetic fluid near the third conduit area 413, and thus the conduit sectional area may be gradually increased from the first conduit area 411 to the third conduit area 413.

A conduit width (width in a direction orthogonal to the flow direction of the magnetic fluid) H of the fourth conduit area 414 viewed from the direction (Z direction) in which the fourth conduit area 414 overlaps the rear magnet 316a may be equal to or larger than a width (diameter) D of the rear magnet 316a, in the corresponding direction, that is, H≥D. This is because the volume of the magnetic fluid affected by the magnetic field generated by the rear magnet 316a is larger and the circulation efficiency of the magnetic fluid is higher than those in a case of H<D.

Each of the projected areas of the first and third conduit areas 411 and 413 on the XY plane is larger than any one of those of the second and fourth conduit areas 412 and 414 on the XY plane, and the first and third conduit areas 411 and 413 contact the heating unit 404 and the cooling unit 405 in wide ranges. Thus, the heat transport efficiency from the outside of the circulation conduit 402 to the circulation conduit 402 becomes high. That is, the heat transport efficiency to the magnetic fluid becomes high. Since the heat transport efficiency with the outside of the circulation conduit 402 is high, a temperature difference between the first conduit area 411 and the fourth conduit area 414 becomes large, and the circulation efficiency of the magnetic fluid becomes high.

First Modification

Figure 9:
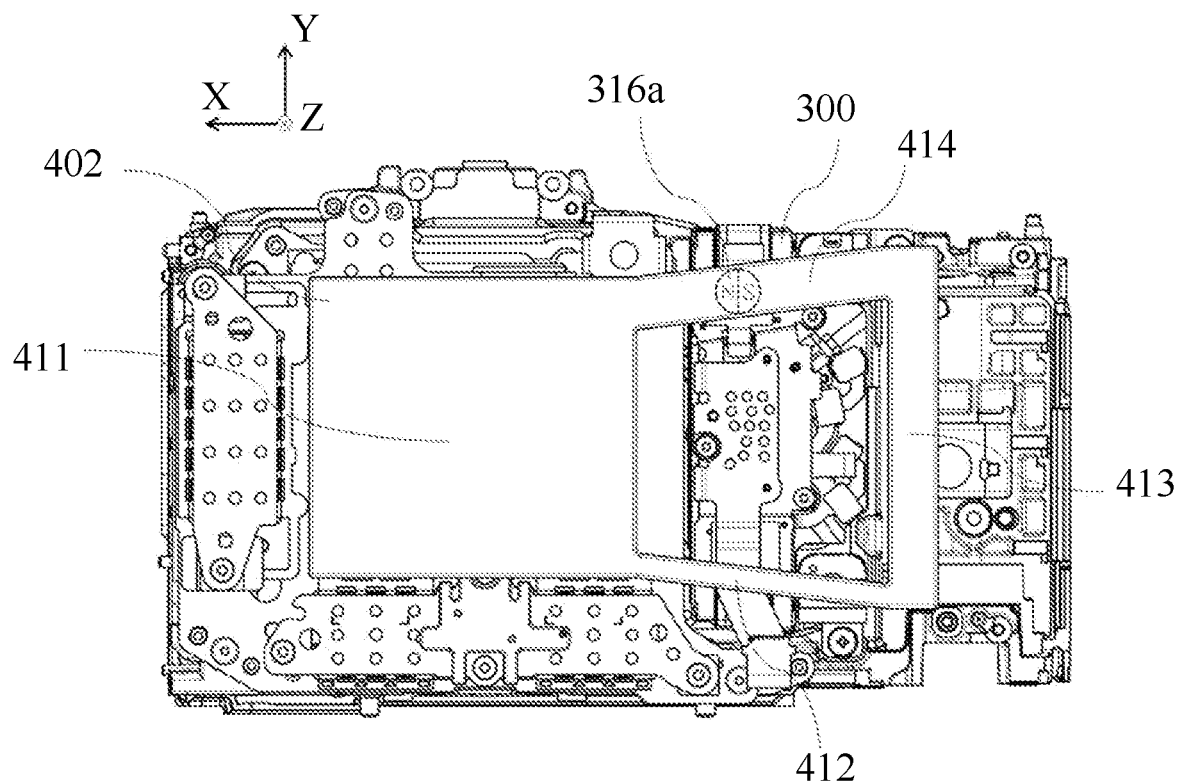
FIG. 9 is a rear view illustrating a camera that includes magnetic fluid heat transport system according to a modification of the first embodiment.

FIG. 9 illustrates a camera that includes magnetic fluid heat transport system according to a modification of the first embodiment. In this modification, each of the second and fourth conduit areas 412 and 414 tilts to the X direction so that the flow direction of the magnetic fluid in each of them can contain a gravity direction component or a downstream position is lower than an upstream position in the −Y direction. At this time, the flow of the magnetic fluid flowing in the second and fourth conduit areas 412 and 414 is assisted by the gravity, the circulation efficiency of the magnetic fluid is improved.

Second Modification

Figure 10:
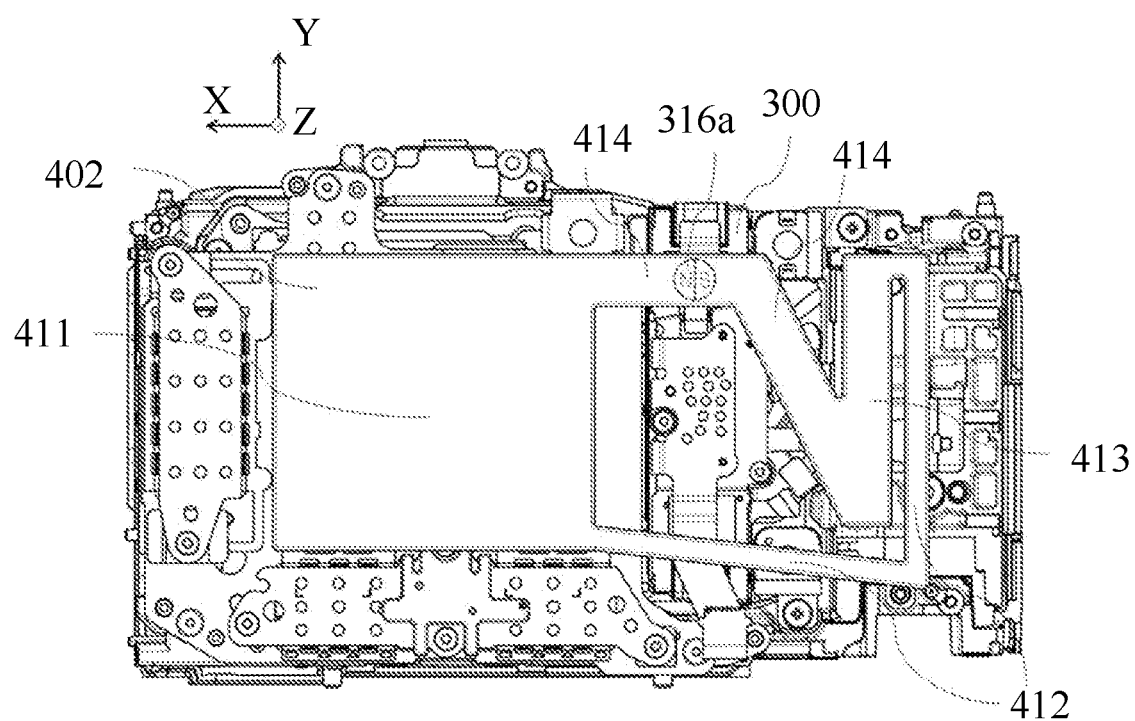
FIG. 10 is a rear view illustrating a camera that includes magnetic fluid heat transport system according to another modification of the first embodiment.

FIG. 10 illustrates a camera that includes a magnetic fluid heat transport system according to another modification of the first embodiment. In this modification, the second conduit area 412 tilts to the X direction so that a downstream position is lower than an upstream position in the −Y direction as in the first modification and the downstream portion extends in the +Y direction. The third conduit area 413 extends in the −Y direction, and the fourth conduit area 414 tilts to the X direction so that the downstream position is higher than the upstream position in the +Y direction. The downstream part of the fourth conduit area 414 extends in the +X direction. When the camera image pickup apparatus) is used, the flow direction of the magnetic fluid in the first conduit area 411 having the largest volume in the circulation conduit 402 and the flow direction of the magnetic fluid in the third conduit area 413 having the next largest volume coincide with the gravity direction. Thus, the magnetic fluid can highly efficiently receive the circulation assistance from the gravity, and the circulation efficiency can be improved.

When the orientation of the camera 100 is changed so that the +X direction is the gravity direction, the flow direction of the upstream part of the fourth conduit area 414 includes the gravity direction component, and the flow direction of the downstream part coincides with the gravity direction. Since the volume in the conduit of the fourth conduit area 414 is larger than that of the second conduit area 412, a sum of the influences of the gravity in the circulation conduit 402 is positive in the circulation direction of the magnetic fluid. As a result, the circulation efficiency of the magnetic fluid can be improved.

In each of the first embodiment, the first modification, and the second modification, the second conduit area 412 has the smallest projected area among the first to fourth conduit areas 411 to 414 on the XY plane and the projected area of the fourth conduit area 414 is larger than that of the second conduit area 412. The projected area of the third conduit area 413 is larger than that of the fourth conduit area 414, and the first conduit area 411 has the largest projected area. The volumes in the conduit of them are also arranged in this order.

Each of the first to fourth conduit areas 411 to 414 may include a plurality of conduits, and the flow direction of the magnetic fluid in the circulation conduit 402 may be reverse to the flow direction.

Second Embodiment

Figure 11:
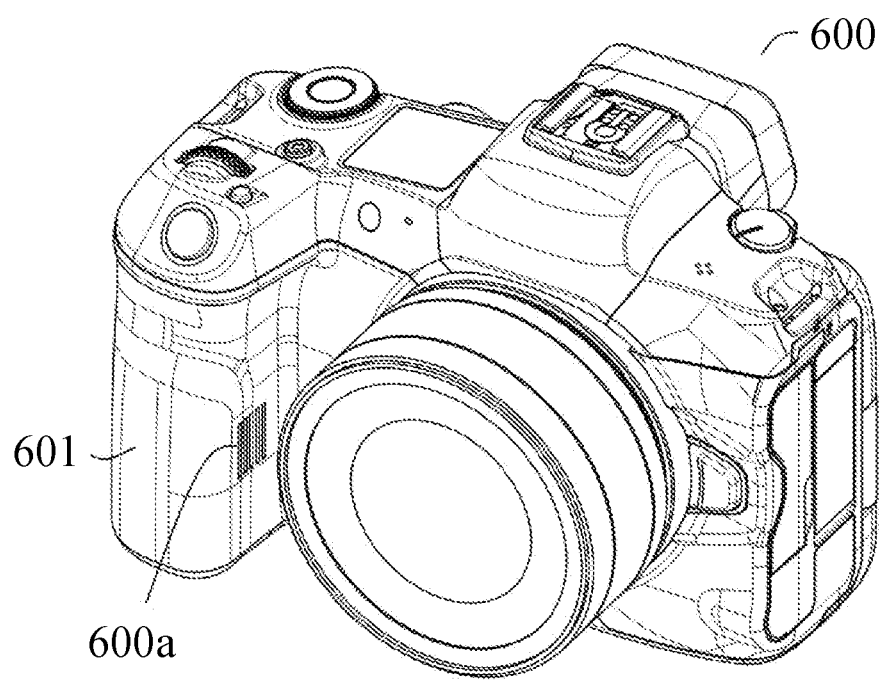
FIG. 11 illustrates an external view of an interchangeable lens and a camera that includes magnetic fluid heat transport system according to a second embodiment.
Figure 12A:
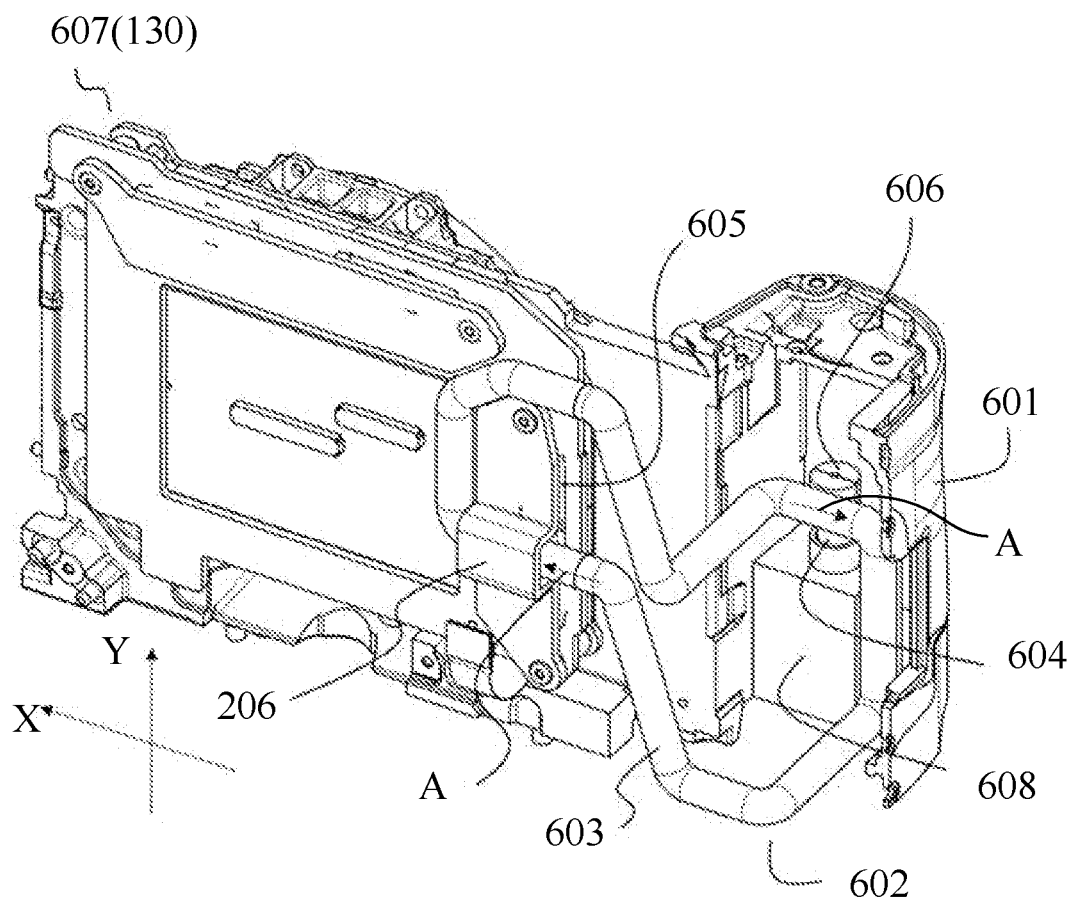
FIGS. 12A and 12B are a perspective view and a partially enlarged view of the magnetic fluid heat transport system according to the second embodiment.

FIG. 11 illustrates a camera 600 that includes a magnetic fluid heat transport system according to a second embodiment. The camera 600 includes a front grip 601 for the user to grip, and has a side slit portion 600a as an intake port on its side surface. A bottom slit portion as an exhaust port is provided on an unillustrated bottom surface of the camera 600. The air sucked from the side slit portion 600a reaches the cooling unit through an unillustrated flow path in the camera 600, and then is discharged from the bottom slit portion, FIG. 12A illustrates a magnetic fluid heat transport system 602 disposed in the camera 600, The magnetic fluid heat transport system 602 includes a circulation conduit 603 in which the magnetic fluid circulates, a first magnet 605 serving as a first magnetic field generator, a second magnet 606 serving as a second magnetic field generator, a heating unit 607, and a cooling unit 608.

The heating unit 607 is a sensor IS unit 130 that includes the image sensor 126 described with reference to FIGS. 3A to 3C. The heat source is the image sensor 126, but the heat generated from the image sensor 126 is transferred to the entire sensor IS unit 130, and the base plate 201 of the sensor IS unit 130 also stores the Beat, Therefore, the entire sensor IS unit 130 becomes the heating unit 607, The circulation conduit 603 is thermally connected to the base plate 201 via an unillustrated heart conductive member, so that the heat of the sensor IS unit 130 (image sensor 126) can be transferred to the magnetic fluid. The circulation conduit 603 may be made of a nonmagnetic material with a low flow path resistance and a high thermal conductivity.

Figure 12B:
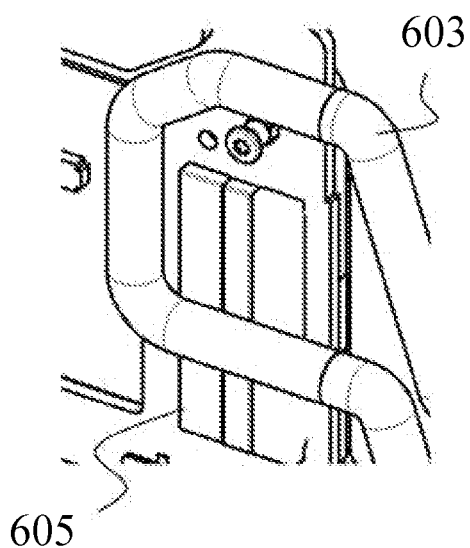

This embodiment uses the magnet 202a mounted on the sensor IS unit 130 as the first magnet 605. Part of the circulation conduit 603 that is close to (opposite) to the first magnet 605 passes between the first magnet 605 and the recess provided in the rear yoke 206. FIG. 12B is a partially enlarged view of the first magnet 605 and the circulation conduit 603, The rear yoke 206 is omitted in FIG. 12B.

The second magnet 606 is held rotatably around an axis extending in the Y direction. The cooling unit 608 is disposed inside the front grip 601. In FIG. 12A, the first magnet 605 is disposed between the heating unit 607 and the cooling unit 608, that is, so that the first magnet 605 faces the circulation conduit 603 on the upstream side of the heating unit 607. Due to the magnetic field generated by the first magnet 605, the magnetic fluid in the circulation conduit 603 circulates in the circulation conduit 603 in an arrow A direction (from the +X direction to the −X direction) illustrated in FIG. 12A. The circulation conduit 603 is disposed so that the magnetic fluid follows the positions of the first magnet 605, the heating unit 607, the second magnet 606, the cooling unit 608, and the first magnet 605 in this order.

The magnetic fluid in the circulation conduit 603 has a high temperature because it is heated by the heat from the heating unit 607 on the side of the heating unit 607 as the downstream side with respect to the position of the first magnet 605 as a reference, and becomes a low temperature because it is cooled by the cooling unit 608 on the side of the cooling unit 608 side as the upstream side. That is, the temperature gradient of the magnetic fluid in the circulation conduit 603 near the first magnet 605 is a positive gradient in the flow direction of the magnetic fluid (so that the temperature becomes higher toward the downstream side).

In this embodiment, the first magnet 605 is the magnet 202a mounted on the fixed unit 200 of the sensor IS unit 130, but another magnet, an electromagnet, or the like may be used as the magnetic field generator.

As described above, the part of the circulation conduit 603 facing the first magnet 605 is disposed between the first magnet 605 and the rear yoke 206. In a range Where the first magnet 605 and the rear yoke 206 face each other, the magnetic flux density increases because the rear yoke 206 collects the magnetic field of the first magnet 605 more. Therefore, the attractive force to the magnetic fluid flowing in this range becomes strong, and the flow efficiency of the magnetic fluid is improved.

Figure 13A:
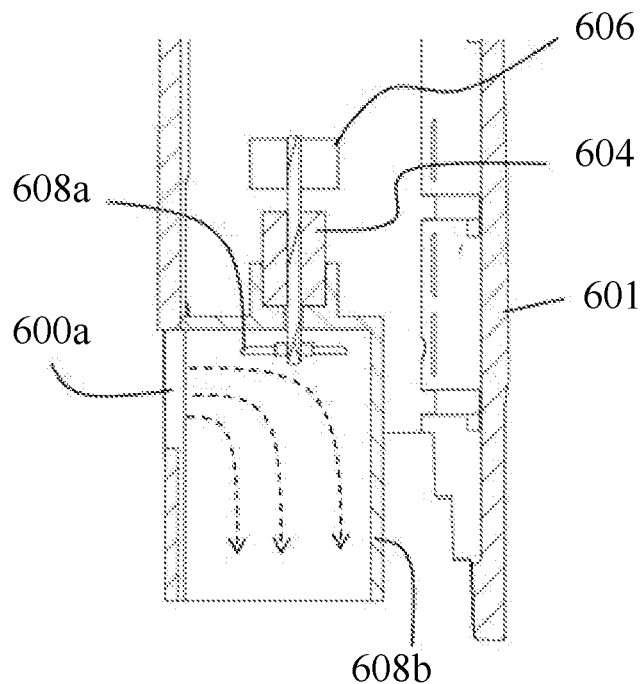
FIGS. 13A to 13C are a sectional view and a schematic view of a cooling unit in the magnetic fluid heat transport system according to the second embodiment.

FIG. 13A illustrates an XY section of the cooling unit 608. The cooling unit 608 includes a fin 608b, and a fan 608a disposed in the fin 608b. The fan 608a is rotationally driven by a motor 604 fixed to the fin 608b, and external air is introduced into the tin 608b from the side slit portion 600a described above as illustrated by broken arrows in the figure, and exhausted from the bottom slit portion described above. The tin 608b is thermally connected to the circulation conduit 603 via an unillustrated heat conductive member. Therefore, the heat of the magnetic fluid in the circulation conduit 603 is absorbed by the air passing through the fin 608b, and the magnetic fluid is cooled. The broken arrow in FIG. 13A indicates the air path.

The second magnet 606 is fixed to part of the rotation shaft of the motor 604 on a side opposite to a side where the fan 608a is fixed. The second magnet 606 is disposed so that the direction of the magnetic field generated from the second magnet 606 faces the circulation conduit 603. The motor 604 may be a brushless motor, and in this case a magnet which is a rotor of the brushless motor may be extended to the outside and used for the second magnet 606.

Figures 13B, 13C:
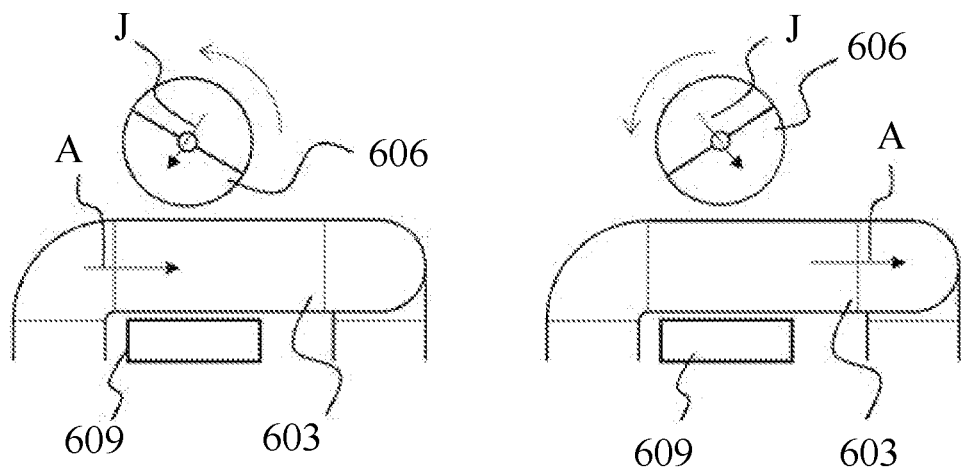

FIGS. 13B and 13C are enlarged views of the circulation conduit 603 and the second magnet 606 near it. The second magnet 606 is rotated from a state in which a direction J of the magnetic field generated from it faces the upstream side of the circulation conduit 603 as illustrated in FIG. 13B to a state in which the direction J faces the downstream side as illustrated in FIG. 13C. At this time, the magnetic fluid attracted to the second magnet 606 side receives a force flowing in the arrow A direction due to the rotation of the second magnet 606. That is, the flow of the magnetic fluid 401 can be assisted by setting the rotating direction of the second magnet 606 to a direction of the force that causes the magnetic fluid to flow in the arrow A direction (circulating direction in the circulation conduit).

In FIGS. 13B and 13C, a yoke 609 is provided opposite to the second magnet 606 with respect to the circulation conduit 603. The yoke 609 can more efficiently collect the magnetic field from the second magnet 606, and improve the flow assisting effect of the magnetic fluid due to the rotation of the second magnet 606.

The circulation conduit 603 is thermally connected to the fin 608b of the cooling unit 608 as described above after passing through a zone where the flow of the magnetic fluid is assisted by the rotation of the second magnet 606. That is, a temperature gradient of the magnetic fluid near the second magnet 606 is almost 0 in the flow direction (arrow A direction). An absolute value of the temperature gradient is smaller than the above positive temperature gradient. A spot where the circulation conduit 603 is thermally connected to the cooling unit 608 is located on the downstream side of the range where the yoke 609 faces the circulation pipe 603. Therefore, the magnetic fluid is hardly cooled in the zone where the rotation of the second magnet 606 assists the flow of the magnetic fluid.

The density of the magnetic flux generated by the first magnet 605 may be higher than that of the second magnet 606. Thereby, even if the second magnet 606 stops rotating due to powering off of the camera 600 or the like, the flowing force given to the magnetic fluid by the magnetic field generated by the first magnet 605 is stronger than the flow preventive force applied by the second magnet 606, and the magnetic fluid can be smoothly circulated.

As described above, the rotatable second magnet 606 disposed near a position in the circulation conduit 603 where the temperature gradient of the magnetic fluid becomes almost 0 can efficiently transport the heat of the heating unit 607 to the cooling unit 608, even if the rotations of the fan 608a and the second magnet 606 are stopped. Cooling the image sensor 126 with the heat transport system using the magnetic fluid can relax the imaging limitation caused by the temperature rise of the image sensor 126.

The electric power may be generated by using a temperature difference between the heating unit 607 and the cooling unit 608 and a Peltier element, and used to rotate the fan 608a of the cooling unit 608. Even after the camera 600 is powered off, cooling by the fan 608a may be continued by the electric power generated by the Peltier element while there is a temperature difference between the heating unit 607 and the cooling unit 608.

Third Embodiment

Figure 14:
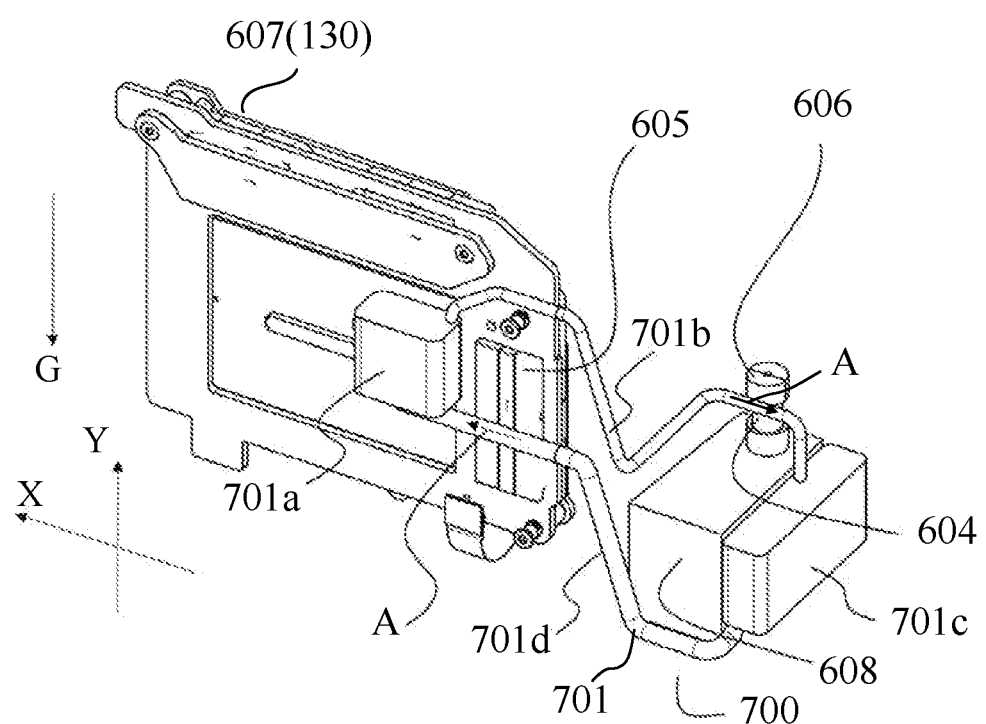
FIG. 14 is a perspective view of magnetic fluid heat transport system according to a third embodiment.

FIG. 14 illustrates magnetic fluid heat transport system 700 according to a third embodiment. The magnetic fluid heat transport system 700 according to this embodiment is also attached to the camera 600 illustrated in FIG. 6. In this embodiment, those elements, which are corresponding elements in the second embodiment, will be designated by the same reference numerals as those in the second embodiment.

The magnetic fluid heat transport system 700 has a circulation conduit 701 in which the magnetic fluid circulates, a first magnet 605, a second magnet 606, a heating unit 607, and a cooling unit 608. Even in this embodiment, the heating unit 607 is a sensor IS unit 130 mounted with the image sensor 126. The first magnet 605 uses a magnet 202a mounted on the sensor IS unit 130. The second magnet 606 is rotatably held around an axis extending in the Y direction. The cooling unit 608 is disposed inside the front grip 601 illustrated in FIG. 6.

In FIG. 14, the first magnet 605 is disposed between the heating unit 607 and the cooling unit 608. Due to the magnetic field generated by the first magnet 605, the magnetic fluid in the circulation conduit 701 circulates in the circulation conduit 701 in the arrow A direction (from the +X direction to the −X direction). The circulation conduit 701 is disposed so that the magnetic fluid follows the positions of the first magnet 605, the heating unit 607, the second magnet 606, the cooling unit 608, and the first magnet 605 in this order.

The circulation conduit 701 has a first conduit area 701a thermally connected to the heating unit 607 (and heated by the heating unit 607), a second conduit area 701b from the heating unit 607 to the cooling unit 608, a third conduit area 701c thermally connected to the cooling unit 608 (and cooled by the cooling unit 608), and a fourth conduit area 701d from the cooling unit 608 to the heating unit 607.

The first magnet 605 is disposed so as to be close (opposite) to the part of the fourth conduit area 701d just before the first conduit area 701a. Therefore, the magnetic fluid receives a force flowing in the +X direction in the fourth conduit area 701d due to the magnetic field generated by the first magnet 605.

When the camera (image pickup apparatus) is used at a normal orientation, a −Y direction as the flow direction of the magnetic fluid in the third conduit area 701c coincides with a gravity direction G. A volume in the conduit of the third conduit area 701c is larger than that of each of the other conduit areas 701a, 701b, and 701d. The flow assisting action of the gravity on the magnetic fluid in the third conduit area 701c is larger than the flow preventive action on the magnetic fluid in each of the other conduit areas 701a, 701b, and 701d. A volume in the conduit of the fourth conduit area 701d in which the magnetic fluid having a high viscosity and a low temperature flows is larger than that of the second conduit area 701b in which the magnetic fluid having a low viscosity and a high temperature flows. Since the volume in the conduit of the fourth conduit area 701d through which the magnetic fluid having a higher viscosity flows is larger, the flow resistance caused by the viscosity of the magnetic fluid can be relaxed.

The second magnet 606 is disposed so as to be close (opposite) to part of the second conduit area 701b just before the third conduit area 701c. As described in the second embodiment, the second magnet 606 is rotated to assist the flow of the magnetic fluid, and when the rotation of the second magnet 606 is stopped, the second magnet 606 may hinder the flow of the magnetic fluid. The volume in the conduit of the second conduit area 701b facing the second magnet 606 is smaller than the volume in the conduit of the fourth conduit area 701d facing the first magnet 605. The density of the magnetic flux generated by the second magnet 606 is lower than that generated by the first magnet 605. Thereby, the force that causes the magnetic fluid to flow using the magnetic field generated by the first magnet 605 is stronger than the force that inhibits the flow of the magnetic fluid and is caused by the second magnet 606 that stops rotating. Therefore, even if the rotation of the second magnet 606 is stopped due to powering off of the camera or the like, the magnetic fluid can be smoothly flowed.

Similar to the second embodiment, this embodiment disposes the second rotatable magnet 606 near a position in the circulation conduit 603 where the temperature gradient of the magnetic fluid becomes almost zero. Thereby, even if the rotation of the second magnet 606 is stopped the heat of the heating unit 607 can be efficiently transported to the cooling unit 608.

Each of the above embodiments has discussed the magnetic fluid heat transport system mounted on the camera, but may mount the magnetic fluid heat transport system having the same configuration as that of each embodiment on an electronic apparatus or an apparatus other than the camera.

Each of the above embodiments can improve the heat transport efficiency using the conduit designed based on the viscosity of the magnetic fluid and the gravity. Even if the rotation of the magnet is stopped, the magnetic fluid can be smoothly circulated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-021461, filed on Feb. 15, 2021, which is hereby incorporated by reference herein in its entirety.

What is claimed is:

1. An image pickup apparatus comprising:
an image sensor as a heating unit;
a grip as a cooling unit,
a conduit configured to circulate magnetic fluid having temperature sensitivity between the image sensor and the grip;
a magnetic field generator disposed on an object side in an optical axis direction further than the conduit and configured to apply a magnetic field to the magnetic fluid; and
a display unit configured to display a live-view image corresponding to an imaging signal from the image sensor,
wherein the image pickup apparatus has a configuration in which a holding member that holds the image sensor, the conduit and the display unit are arranged in order from the object side,
wherein the conduit includes a first conduit area in which the magnetic fluid receives heat from the image sensor, a second conduit area from the first conduit area to the grip, a third conduit area in which the magnetic fluid is cooled by the grip, and a fourth conduit area from the grip to the image sensor,
wherein, when the image pickup apparatus is viewed from a back side in the optical axis direction, the magnetic field generator is disposed between the first conduit area and the third conduit area, and
wherein a conduit volume inside the first conduit area is larger than that inside any of the second, third and fourth conduit areas.

2. The image pickup apparatus according to claim 1, wherein a flow direction of the magnetic fluid flowing through the first conduit area coincides with a gravity direction.

3. The image pickup apparatus according to claim 2, wherein the conduit volume inside the fourth conduit area is larger than that inside the second conduit area.

4. The image pickup apparatus according to claim 3, wherein a conduit sectional area inside the second conduit area gradually increases from the first conduit area toward the third conduit area.

5. The image pickup apparatus according to claim 1, wherein, when the image pickup apparatus is viewed from the back side, a magnet constituting the magnetic field generator overlaps the fourth conduit area.

6. The image pickup apparatus according to claim 1, wherein each of projected areas of the first and third conduit areas on a plane orthogonal to an optical axis is larger than any one of those of the second and fourth conduit areas on the plane.

* * * * *